US006949173B2

(12) United States Patent
Sauer

(10) Patent No.: US 6,949,173 B2
(45) Date of Patent: Sep. 27, 2005

(54) CONTINUOUS COATING SYSTEM

(75) Inventor: Andreas Sauer, Grossostheim (DE)

(73) Assignee: Applied Films GmbH & Co. KG, Alzenau (DE)

( * ) Notice: Subject to any disclaimer, the term of this patent is extended or adjusted under 35 U.S.C. 154(b) by 98 days.

(21) Appl. No.: 10/445,101

(22) Filed: May 23, 2003

(65) Prior Publication Data

US 2004/0069624 A1 Apr. 15, 2004

(30) Foreign Application Priority Data

Oct. 9, 2002 (DE) ........................................ 102 47 002

(51) Int. Cl.[7] .......................... C23C 14/34; C23C 16/00
(52) U.S. Cl. ........................... 204/298.24; 204/298.25; 118/718
(58) Field of Search ....................... 204/298.24, 298.25; 118/718

(56) References Cited

U.S. PATENT DOCUMENTS 4,795,299 A * 1/1989 Boys et al. ................. 414/217
5,110,249 A * 5/1992 Norman ...................... 414/217
5,135,635 A 8/1992 Ikeda .................... 204/298.25
6,302,372 B1 10/2001 Sauer et al. ................ 251/167

* cited by examiner

*Primary Examiner*—Steven Versteeg
(74) *Attorney, Agent, or Firm*—Needle & Rosenberg, PC

(57) ABSTRACT

A continuous coating system has several treatment chambers (1, 2) that are arranged one after the other in such a way that in each case, a wall (3) of one treatment chamber (1) having a passage (5) contacts a wall (4) in the adjacent treatment chamber (2) that also has a passage (6). One of the passages (5) is provided in a sealing insert (7), which supports itself on the same side with a first support surface (9) on the wall (3) of one treatment chamber (1) and with a second support surface (10) against the wall (4) of the adjacent treatment chamber (2). Between the two support surfaces (9, 10) and the respective walls (3, 4), in each case there is a surrounding gasket (13, 14) against the respective support surface (9, 10) and the wall (3, 4).

8 Claims, 1 Drawing Sheet

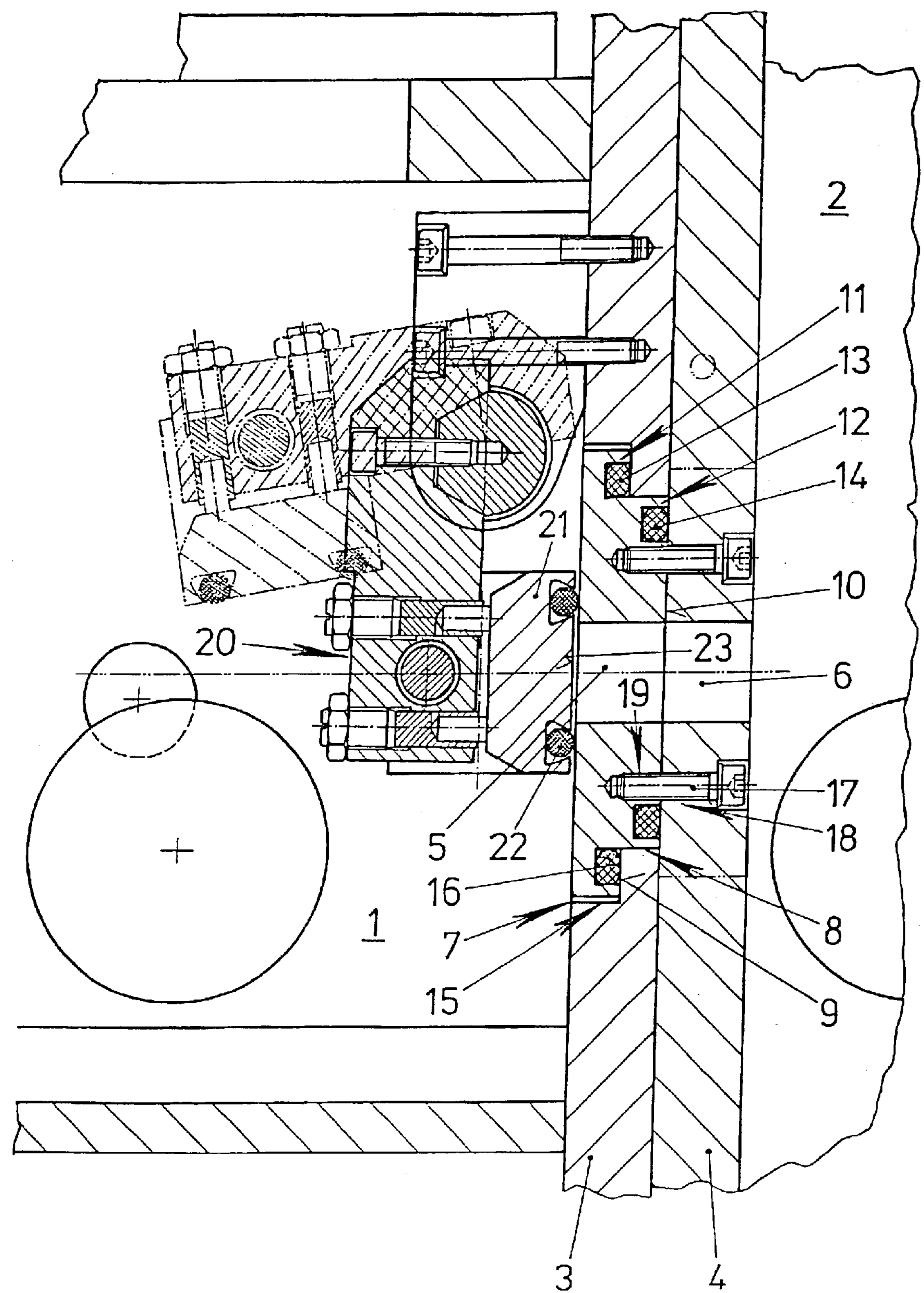
2
11
13
12
14
21
10
20
23
6
19
17
18
5
22
16
8
1
7
15
9
3
4

CONTINUOUS COATING SYSTEM

CROSS REFERENCE TO RELATED APPLICATIONS

The present application claims priority to German Patent Application No. 10247002.2, filed Oct. 9, 2002, which application is incorporated herein fully by this reference.

The invention relates to a continuous coating system with several separate treatment chambers that are arranged one after the other in such a way that, in each case, a wall of one treatment chamber having a passage contacts a wall in the adjacent treatment chamber that also has a passage and in which the two passages are sealed toward the outside by a seal mounted between the walls.

Such continuous coating systems are built as sputtering systems, for example and are generally known and customary for creating a stack of layers on substrates. Currently they can have over 30 treatment chambers arranged in sequence and be a total of over 100 m long. The passages in the face walls of the treatment chambers are used to be able to transport the substrates from one to another treatment chamber. In order to be able to seal the individual treatment chambers from atmospheric pressure, currently a seal surrounding the passage is arranged between the walls of the individual treatment chambers, so that after connecting the individual walls of the treatment chambers, a complete vacuum-sealed complete system is created.

The disadvantage with such continuous coating system is that a great deal of effort is required for replacing the respective gasket between the walls of adjacent treatment chamber. For example, if a gasket is leaking in the center area of such a system, all the treatment chambers before it on one side have to be disassembled in order to be able to get to the defective gasket. In large systems this causes a production shutdown of several weeks in many cases. This means that a leak in such gaskets leads to extreme economic consequences.

The invention is based on the problem of designing a continuous coating system of the type named at the beginning in such a way that the replacement of the gaskets arranged between the individual treatment chambers can be carried out as simply and quickly as possible.

According to the invention, this problem is solved in that one of the passages is provided in a sealing insert, which supports itself on the same side with a first support surface on the wall of one treatment chamber and with a second support surface against the wall of the adjacent treatment chamber and that, between the two support surfaces and the respective walls, against which they support themselves, in each case a surrounding gasket is provided that contacts the respective support surface and the wall.

Such gasket inserts can be removed without disconnecting the treatment chambers that are sealed by it, since they are mounted not between the treatment chambers, but inside the treatment chambers and therefore can be moved in the direction of the inside of the treatment chamber after the fastener that holds it is loosened from the respective wall. Therefore, the sealing inserts can be removed from the individual treatment chambers and then the gaskets replaced.

The sealing insert has an especially simple structure if it is designed as in a ring wheel shape and one support surface is formed by the face side of the sealing insert and the other support surface is formed by a step on the sealing insert.

The gaskets can easily be removed and installed outside the treatment chamber, if according to a further development of the invention, the sealing insert has a surrounding groove with an O-ring as a seal in each of its two support surfaces. Because of this, the gaskets do not have to be installed in the walls of the treatment chambers, it is much more the case that individual, easy to handle, sealing inserts can be provided with the gaskets.

The sealing insert can be mounted flush in the wall of the treatment chamber that holds it, if its support surface formed by the step, contacts a contact surface that is formed of a recess in the wall of the treatment chamber that holds the sealing insert.

The sealing inserts are fastened easily in that the sealing insert is held against the walls by screws and these screws lead from the wall of the treatment chamber adjacent to the treatment chamber with the sealing insert, within the area of the other treatment chamber surrounded by the gasket contacting the adjacent treatment chamber, into threaded holes of the sealing insert. Such an embodiment ensures that no connection from the inside of the treatment chambers to the atmosphere develops due to the screws, since within the area surrounded by the respective gasket, the screws go from the wall of one treatment chamber into the wall of the other treatment chamber.

The individual treatment chambers are screwed to each other with their face walls to form a complete system. In small systems, separate connectors for the individual treatment chambers can be eliminated if the sealing insert, with the screws that go into it from the adjacent treatment chamber, simultaneously forms a connecting element for the two adjacent treatment chambers.

In order to be able to partition the individual treatment chambers from each other, so that different pressures can be set at different times, it is customary to mount flap valves that are each able to close the passage in the treatment chamber leading to the other treatment chamber. These flap valves are in closed status with a gasket on a wall area of the treatment chamber surrounding the passage. In practice, due to malfunctions in the substrate transport, it can happen that scratches develop in the wall area that forms the valve seat, which interferes with the seal integrity of the closed flap valves. Previously in such cases it was necessary to grind and polish the sealing surface in order to eliminate such scratches, which was very time consuming since the sealing surfaces within the treatment chambers are very difficult to access. This effort can be avoided according to another further development of the invention if the sealing insert, within the treatment chamber that holds it, is a sealing surface surrounding the opening for a closing element of a flap valve that is mounted in the treatment chamber for closing the passage.

The entire system can be manufactured of cost-effective material, e.g., structural seal, if the sealing insert consists of high-quality stainless steel. Because of this, expensive material only has to be used where permanent good surface quality is required.

The invention allows various embodiments. For further clarification of its basic principle, the drawing shows a cross section of a partial area of a continuous coating system that is important to the invention, which will be described in the following.

The drawing shows, in a continuous coating system, two adjacent areas of two treatment chambers 1, 2 that contact each other with one wall 3, 4 each. A passage 5 leads from treatment chamber 1 to a passage 6 in wall 4, so that the treatment chambers 1, 2 are connected to each other by passages 5, 6. These passages 5, 6 make it possible to transport substrates that are not shown from one treatment chamber 1 or 2 to the other treatment chamber 2 or 1.

In order to prevent a connection from developing between the walls 3, 4 and the atmosphere from the two treatment chambers 1, 2, a ring-shaped sealing insert 7 is provided in treatment chamber 1. Because of a step 8, this sealing insert 7 has to support surfaces 9, 10 on the same side, each with a groove 11, 12, in which a gasket 13, 14 formed as an O-ring is located. In the area of sealing insert 7, wall 3 has a recess 15 so that a contact surface 16 develops. The sealing insert 7 lies with its support surface 9 against the contact surface 16 of wall 3 and simultaneously with its support surface 10 against wall 4. It is held in this position with screws 17, which are each screwed through a hole 18 in wall 4 and into a threaded hole 19 of wall 3. In this process, the gasket 14 is located outside the threaded holes 19 and the holes 18 so that no connection to the atmosphere exists from the treatment chamber 2 through the holes 18 and between walls 3, 4 to the outside. The gasket 13 prevents a connection from treatment chamber 1, past the outside of sealing ring 7 to the outside, while gasket 14, except from a connection by way of holes 18 prevents a connection through passages 5, 6 outside to the atmosphere.

The drawing also shows a flap valve 20, which in the position shown in dotted lines, blocks the passage 5 by means of a closing element 21. To do this, the scaling element 21 with a sealing ring 22 lies against a flat sealing surface 23 of sealing insert 7.

Reference Number List

1 Treatment chamber
2 Treatment chamber
3 Wall
4 Wall
5 Passage
6 Passage
7 Sealing insert
8 Step
9 Support surface
10 Support surface
11 Groove
12 Groove
13 Gasket
14 Gasket
15 Recess
16 Contact surface
17 Screw
18 Hole
19 Threaded hole
20 Flap valve
21 Closing element
22 Sealing ring
23 Sealing surface

What is claimed is:

1. Continuous coating system with several separate treatment chambers that are arranged one after the other in such a way that in each case, a wall of one treatment chamber having a passage contacts a wall in the adjacent treatment chamber that also has a passage and in which the two passages are sealed toward the outside by a seal mounted between the walls, characterized in that one of the passages is provided in a sealing insert, which supports itself on the same side with a first support surface on the wall of one treatment chamber and with a second support surface against the wall of the adjacent treatment chamber and that, between the two support surfaces and the respective wall, against which they support themselves, in each case a surrounding gasket is provided that contacts the respective support surface and the wall.

2. Continuous coating system according to claim 1, characterized in that the sealing insert is designed with a ring wheel shape and one support surface is formed of a face side of the sealing insert and the other support surface is formed of a step on the sealing insert.

3. Continuous coating system according to claim 1, characterized in that the sealing insert has a surrounding groove with an O-ring as the seal in each of its two support surfaces.

4. Continuous coating system according to claim 2, characterized in that the sealing insert, with its support surface formed by the step, contacts a contact surface that is formed of a recess in the wall of the treatment chamber that holds the sealing insert.

5. Continuous coating system according to claim 1, characterized in that the sealing insert is held against the walls by screws and these screws lead from the wall of the treatment chamber adjacent to the treatment chamber with the sealing insert, within the area of the other treatment chamber surrounded by the gasket contacting the adjacent treatment chamber, into threaded holes of the sealing insert.

6. Continuous coating system according to claim 5, characterized in that the sealing insert, with the screws going into it from the adjacent treatment chamber simultaneously forms a connecting element for the two adjacent treatment chambers.

7. Continuous coating system according to claim 1, characterized in that the sealing insert, within the treatment chamber that holds it, is a sealing surface surrounding the opening for a closing element of a flap valve that is mounted in the treatment chamber for closing the passage.

8. Continuous coating system according to claim 7, characterized that the sealing insert consists of stainless steel.

* * * * *